United States Patent [19]
Offord et al.

[11] Patent Number: 5,901,075
[45] Date of Patent: * May 4, 1999

[54] PERFORMANCE OF AN ADAPTIVE WEIGHT FIR FILTER HAVING A TIMESHARED TAP WEIGHT PROCESSOR

[75] Inventors: Glen Edward Offord, Macungie; Jeffrey Lee Sonntag, Rockland Township, both of Pa.

[73] Assignee: Lucent Technologies Inc., Murray Hill, N.J.

[ * ] Notice: This patent issued on a continued prosecution application filed under 37 CFR 1.53(d), and is subject to the twenty year patent term provisions of 35 U.S.C. 154(a)(2).

[21] Appl. No.: 08/577,890

[22] Filed: Dec. 22, 1995

[51] Int. Cl.$^6$ ...................................................... G06F 17/10
[52] U.S. Cl. ...................................................... 364/724.19
[58] Field of Search ......................... 364/724.01, 724.16, 364/724.19, 724.2

[56] References Cited

U.S. PATENT DOCUMENTS

| | | | |
|---|---|---|---|
| 4,564,934 | 1/1986 | Macchi | 370/290 |
| 4,695,969 | 9/1987 | Sollenberger | 364/724.2 |
| 4,754,419 | 6/1988 | Iwata | 364/724.19 |

*Primary Examiner*—Chuong Dinh Ngo

[57] ABSTRACT

An apparatus and a scheme for adapting a plurality of tap weights in an FIR filter wherein tap weights are adapted for a current data cycle utilizing a current subset of data and the tap weights are adapted for a next data cycle utilizing a next subset of data is described. A method of adapting the plurality of tap weights in an adaptive FIR filter comprises assigning a current time slot for a timeshared tap weight processor during a current data cycle and assigning a different time slot for the timeshared tap weight processor during a next data cycle. The tap weights are adapted for the current data cycle utilizing a current subset of data and the tap weights are adapted for the next data cycle utilizing a next subset of data. In a further enhancement of the present invention method the different time slot for the next data cycle is assigned by rotating time slot assignments for the timeshared tap weight processor. An apparatus for adapting the plurality of tap weights comprises a circuit assigning a current time slot for the timeshared tap weight processor during a current data cycle and assigning a different time slot for the timeshared tap weight processor during a next data cycle. The tap weights are adapted for the current data cycle utilizing a current subset of data and the tap weights are adapted for the next data cycle utilizing a next subset of data.

16 Claims, 3 Drawing Sheets

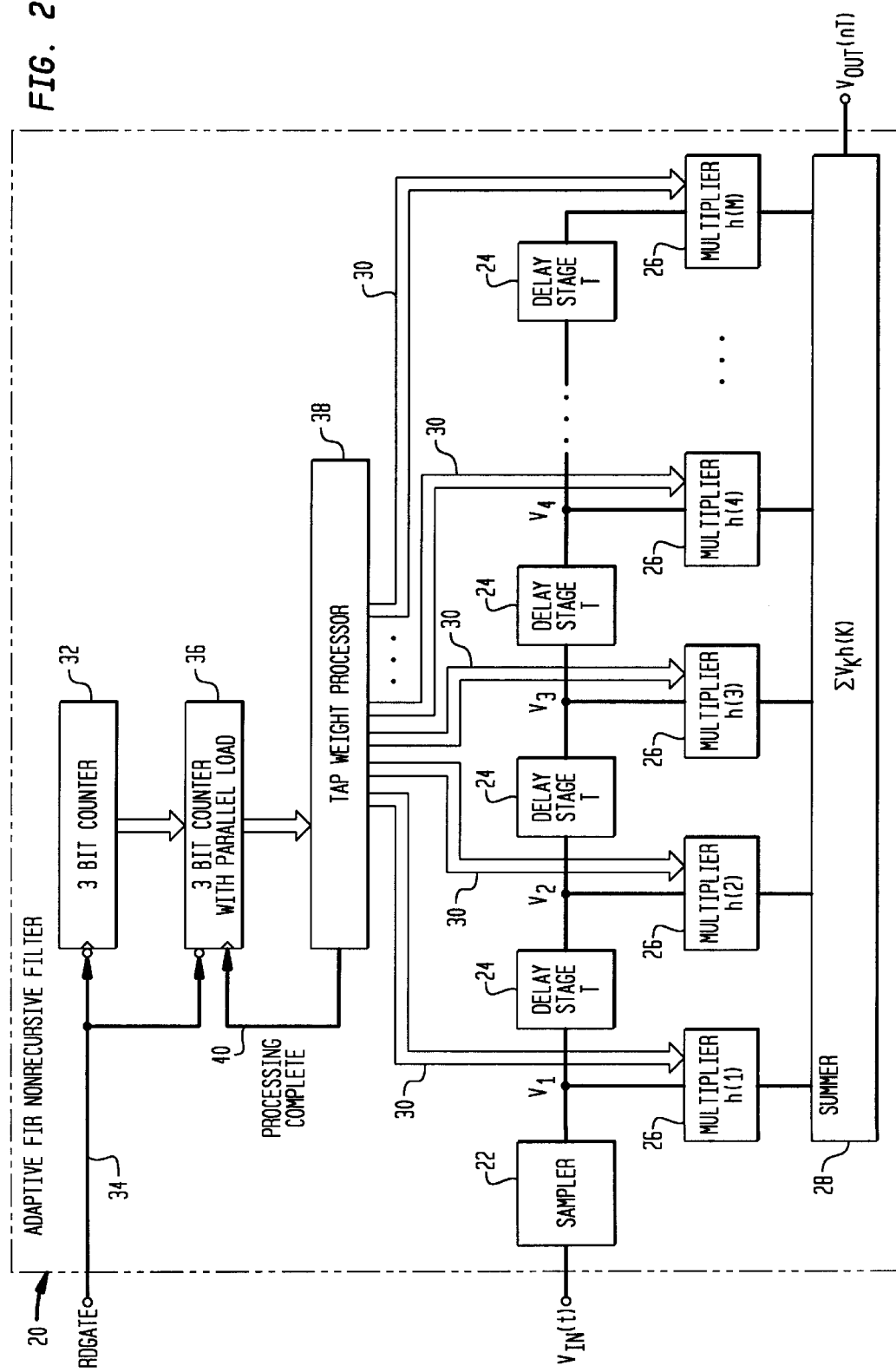

FIG. 3A

|  | DATA SECTOR | | | | | | | | |
|---|---|---|---|---|---|---|---|---|---|
| 1 | 1 | 2 | 3 | 4 | 5 | 6 | 7 | 8 | 1 | ... |
| 2 | 2 | 3 | 4 | 5 | 6 | 7 | 8 | 1 | 2 | ... |
| 3 | 3 | 4 | 5 | 6 | 7 | 8 | 1 | 2 | 3 | ... |
| 4 | 4 | 5 | 6 | 7 | 8 | 1 | 2 | 3 | 4 | ... |
| 5 | 5 | 6 | 7 | 8 | 1 | 2 | 3 | 4 | 5 | ... |
| 6 | 6 | 7 | 8 | 1 | 2 | 3 | 4 | 5 | 6 | ... |
| 7 | 7 | 8 | 1 | 2 | 3 | 4 | 5 | 6 | 7 | ... |
| 8 | 8 | 1 | 2 | 3 | 4 | 5 | 6 | 7 | 8 | ... |

TAP WEIGHT PROCESSING TIME SLOT ASSIGNMENT

RDGATE CYCLE

FIG. 3B

|  | DATA SECTOR | | | | | | | | |
|---|---|---|---|---|---|---|---|---|---|
| 1 | 8 | 7 | 6 | 5 | 4 | 3 | 2 | 1 | 8 | ... |
| 2 | 7 | 6 | 5 | 4 | 3 | 2 | 1 | 8 | 7 | ... |
| 3 | 6 | 5 | 4 | 3 | 2 | 1 | 8 | 7 | 6 | ... |
| 4 | 5 | 4 | 3 | 2 | 1 | 8 | 7 | 6 | 5 | ... |
| 5 | 4 | 3 | 2 | 1 | 8 | 7 | 6 | 5 | 4 | ... |
| 6 | 3 | 2 | 1 | 8 | 7 | 6 | 5 | 4 | 3 | ... |
| 7 | 2 | 1 | 8 | 7 | 6 | 5 | 4 | 3 | 2 | ... |
| 8 | 1 | 8 | 7 | 6 | 5 | 4 | 3 | 2 | 1 | ... |

TAP WEIGHT PROCESSING TIME SLOT ASSIGNMENT

RDGATE CYCLE

PERFORMANCE OF AN ADAPTIVE WEIGHT FIR FILTER HAVING A TIMESHARED TAP WEIGHT PROCESSOR

FIELD OF THE INVENTION

This invention relates to a Finite Impulse Response filter, and more particularly to an adaptive weighting coefficient Finite Impulse Response filter.

BACKGROUND OF THE INVENTION

A variety of digital techniques provide means of integrating filters capable of meeting high quality filter specifications. The performance of these filters typically equals and in particular cases exceeds performance available with passive RLC filters.

Some truly integrated filters are discrete time filters in which a continuous time signal is sampled with a fixed periodicity and the analog amplitudes of the signal at the sample are linearly manipulated and transformed or digitally coded and processed before transformation. Filters which process sampled data linearly are classified as either Infinite Impulse Response (IIR) recursive filters or Finite Impulse Response (FIR) nonrecursive filters, depending upon whether the filter does or does not use recursion in internal loops when processing the samples.

While microprocessors are particularly suited for applications where speed and data handling size are not critical, they are not particularly well suitable for many data intensive applications. For example, medical imaging systems, speech recognition systems, and radar systems require that very large amounts of data be processed in real time. To increase their processing speed, a number of the systems utilize digital signal processors, which are optimized to process the sampled data at high rates. The repetitive nature of the signals allow the architecture of the digital signal processor to be optimized.

Referring to FIG. 1, there is shown a FIR filter 10. The FIR filter 10 has a sampler 12 which samples the input signal $V_{in}(t)$ at a sampling frequency of $f_s=1/T$. The output of the sampler 12 is coupled to M delay stages 14 in sequence. Each delay stage 14 delays the associated sample by the period T. The delayed sampled signal $V_K$ at each node K is coupled to a multiplier 16 where the signal is multiplied by the tap weighting coefficient h(K). The outputs of the multipliers 16 are coupled to a summer 18 which sums the products of the multiplication. The output of the summer 18 is coupled to provide the output of the filter $V_{out}(nT)$.

The FIR filter output $V_{out}(nT)$ is shown in Equation 1.

$$V_{out}(nT) = \sum_{k=1}^{M} h(K)V_K(nT). \qquad \text{Equation 1}$$

At t=nT the delay associated with node K is (K−1)T. Therefore, the signal at the node $V_K(nT)$ is shown in Equation 2 and the filter output is shown in Equation 3.

$$V_K(nT) = V_{IN}[nT - (K-1)T]. \qquad \text{Equation 2}$$

$$V_{out}(nT) = \sum_{k=1}^{M} h(K)V_{IN}[nT - (K-1)T]. \qquad \text{Equation 3}$$

This represents the linear convolution of the sequences h(K) and the sampled input signal. Where h(K) is the sequence of coefficients defining the impulse response of the filter, which is determined as the inverse Fourier transform of the desired filter response in the frequency domain, $V_{OUT}(nT)$ is the desired filter output in discrete time.

An adaptive FIR filter adapts the tap weighting coefficients h(K) of the multipliers 16 in response to the signal being processed. When a single tap weight processing element is timeshared in order to adapt all of the tap weighting coefficients h(K), then each of the tap weighting coefficients h(K) are adapted only 1/N of the time. With scrambled and non-repetitive data, this method of adaptation presents no problem, other than increasing the time required for adaptation. However, when the data is repetitive, even if it is scrambled, as in the case of reading the same data field over and over in a disk drive, the subsets of the data bits that are utilized to adapt the weighting coefficients of each tap are invariant. Each tap coefficient is adapted with the subset of all the data during each attempt to read the data field.

While the scrambling of the data may ensure that the data spectrum is nearly white noise, the power spectral density of the small, fixed collection of bits which are used to adapt the weighting coefficient of each tap may not be sufficiently white noise like to ensure adaptation to the best possible tap weighting coefficient vector. This problem is worse when reading shorter data fields.

Therefore, there is a need to optimize the adaptation of a finite impulse response filter when processing repetitive data.

SUMMARY OF THE INVENTION

In accordance with the present invention, an apparatus and a scheme for adapting a plurality of tap weights in an FIR filter wherein tap weights are adapted for a current data cycle utilizing a current subset of data and the tap weights are adapted for a next data cycle utilizing a next subset of data.

In an adaptive FIR filter having a plurality of tap weights, a method of adapting the plurality of tap weights comprises assigning a current time slot for a timeshared tap weight processor during a current data cycle and assigning a different time slot for the timeshared tap weight processor during a next data cycle. The tap weights are adapted for the current data cycle utilizing a current subset of data and the tap weights are adapted for the next data cycle utilizing a next subset of data.

A time slot, as known to one skilled in the art, is defined as any cyclic time interval that can be recognized and defined uniquely. See The New IEEE Standard Dictionary of Electrical and Electronic Terms, 5th Edition, IEEE, Inc. (1993). In a FIR filter, each time slot corresponds to one of the tapped delay lines. The frequency by which the input continuous-time function is sampled relates to the corresponding time slot. The sampling frequency is 1/T, where T is the period by which the associated sample is delayed.

In a further enhancement of the present invention method the different time slot for the next data cycle is assigned by rotating time slot assignments for the timeshared tap weight processor.

In an adaptive FIR filter having a plurality of tap weights and a timeshared tap weight processor, an apparatus for adapting the plurality of tap weights comprises a circuit assigning a current time slot for the timeshared tap weight processor during a current data cycle and assigning a different time slot for the timeshared tap weight processor during a next data cycle. The tap weights are adapted for the current data cycle utilizing a current subset of data and the tap weights are adapted for the next data cycle utilizing a next subset of data.

In a further enhancement of the present invention apparatus the different time slot for the next data cycle is assigned by rotating time slot assignments for the timeshared tap weight processor.

An adaptive FIR filter having a timeshared tap weight processor coupled to each of a plurality of multiplier circuits for providing a predetermined tap weight where the tap weights are adapted for a current data cycle utilizing a current subset of data and the tap weights are adapted for a next data cycle utilizing a next subset of data is also described in accordance with the present invention.

DESCRIPTION OF THE DRAWINGS

The present invention is described in detail below in conjunction with the drawings, of which:

FIG. 2 shows an adaptive FIR filter of the present invention;

FIGS. 3A and 3B show two representative time slot assignments for tap weighting coefficient processing with N=8.

DETAILED DESCRIPTION OF VARIOUS ILLUSTRATIVE EMBODIMENTS

Figure 1:
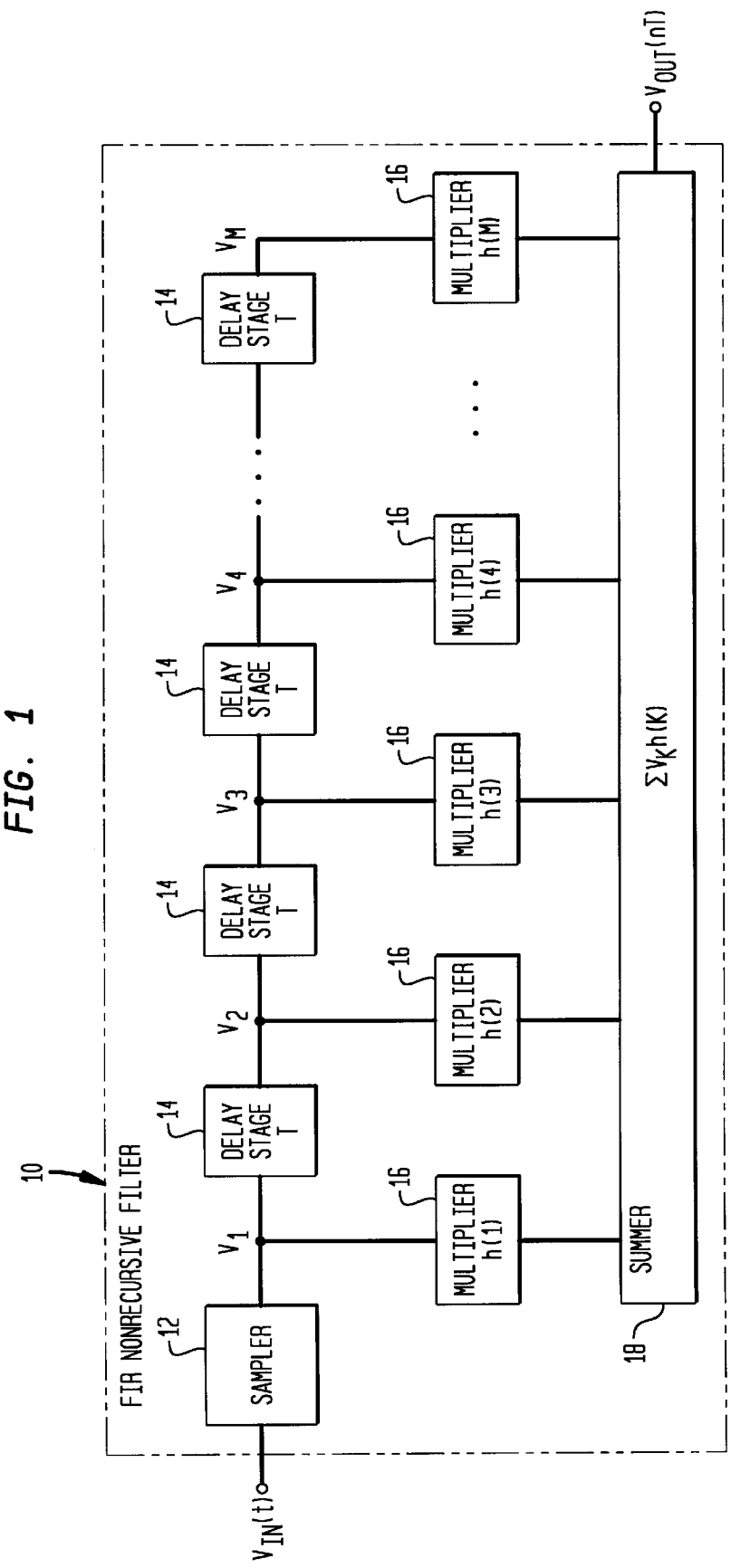
FIG. 1 shows a prior art FIR filter.

Referring to FIG. 2, there is shown an exemplary embodiment of an adaptive FIR filter 20 of the present invention for 8 tap weighting coefficients (N=8). The present invention is equally well suited for use with adaptive FIR filters having more than 8 tap weighting coefficients (N>8) as well as less than 8 tap weighting coefficients (N<8). The choice of N=8 is for simplicity of illustrating the present invention and is not a limitation as such. The adaptive FIR filter 20 has a sampler 22 which samples the input signal $V_{in}(t)$ at a sampling frequency of $f_s=1/T$. The output of the sampler 22 is coupled to seven delay stages 24 in sequence. Each delay stage 24 delays the associated sample by the period T. The delayed sampled signal $V_K$ at each node K is coupled to a multiplier 26 where the signal is multiplied by the tap weighting coefficient h(K). The outputs of the multipliers 26 are coupled to a summer 28 which sums the products of the multiplication. The output of the summer 28 is coupled to provide the output of the FIR filter $V_{out}(nT)$. The tap weighting coefficients h(K) of the multipliers 26 are adapted in response to a tap weight line 30.

A first three bit counter 32 determines which time slot assignment will be used and is advanced at the end of each read in response to a signal on an RDGATE line 34. The output of the first 3 bit counter 32 is coupled to a second 3 bit counter 36 having a parallel load. The second 3 bit counter 36 is parallel loaded after each signal on the RDGATE line 34, starting at a different place and cycling through all eight taps over and over during each RDGATE signal cycle. The output of the second three bit counter 36 is coupled to a tap weight processor 38 to supply the address of the tap weight that is to be processed. The tap weight processor 38 processes the indicated tap weight for a predetermined number of system clock cycles. After the tap weight processor 38 has finished the processing, it applies a signal on a Processing Complete line 40 which is coupled to the second 3 bit counter 36. The signal on the Processing Complete line 40 indicates that processing by the tap weight processor 38 has finished, and causes a new address to be supplied from the second 3 bit counter 36. The tap weight processor 38 has 8 output signal lines (N=8) each W bits wide. The output signal lines are coupled to each of the multipliers 26 of the adaptive FIR filter 20.

FIGS. 3A and 3B represent how the tap weight coefficients are assigning a different time slot during the next data cycle that exposes each of the of tap weights to a larger set of data. By assigning a different time slot between subsequent data cycles even when the data is repetitive, the subsets of the data bits that are utilized to adapt (update) the weighting coefficients of each tap will not be invariant.

Referring to FIG. 3A there is shown the time slot assignments for tap weighting coefficient processing with N=8. In this exemplary embodiment, the time slot assignments that are made for the tap weight processor are rotated or advanced for each read cycle event (data cycle). If each tap is processed on N different sets of data during N read events, then each tap eventually processed all of the data rather than just 1/Nth of the data. FIG. 3B shows the time slot assignments for tap weighting coefficient processing with N=8 where the rotation is the reverse of that shown in FIG. 3A.

Any variety of sequences and patterns can be utilized for the time slot assignments and or the order in which the tap weights are processed within each time slot assignment, provided that each tap, when it is adapted, is exposed to a much larger number of different data symbols than they would have been if the time slot assignments were fixed. For example, in an alternative to the sequential rotation shown above, the time slots and the order in which the tap weights are processed may be rotated in a pseudo random sequence.

There are many approaches known to those skilled in the art for determination of tap coefficients in relation to one another for given channel conditions. One is least mean-square error (LMSE).

Suppose that the desired output from the FIR filter equalizer of FIG. 2 is d(t) which is $V_{out}(nT)$. An LMSE criterion then seeks the tap weights that minimize the mean-square error between the desired output from the equalizer and its actual output. Since this output includes noise, we denote it by z(t) to distinguish it from the pulse response of the equalizer. The LMSE criterion is therefore expressed as $$\mathscr{E} = E\{[z(t)-d(t)]^2\} = \text{minimum} \qquad (7.178)$$

where, if y(t) is the equalizer input including noise, the equalizer output is $$z(t) = \sum_{n=-N}^{N} \alpha_n y(t - n\Delta) \qquad (7.179)$$

Since $\mathscr{E}$ is a concave function of the tap weights, a set of sufficient conditions for minimizing the tap weight is $$\frac{\partial \mathscr{E}}{\partial \alpha_m} = 0 = 2E\left\{[z(t)-d(t)]\frac{\partial z(t)}{\partial \alpha_m}\right\}, m = 0, \pm 1, \ldots, \pm N \qquad (7.180)$$

Substituting (7.179) in (7.178) and carrying out the differentiation, we obtain the conditions $$E\{[z(t)-d(t)]y(t-m\Delta)\}=0, \qquad (7.181)$$

m=0, ±1, ±2, . . . , ±N or $$R_{yz}(m\Delta)=R_{yd}(m\Delta), \qquad (7.182)$$

m=0, ±1, ±2, . . . , ±N
where $$R_{yz}(\tau)=E[y(t)z(t+\tau)] \qquad (7.183)$$

and $$R_{yd}(\tau)=E[y(t)d(t+\tau)] \quad (7.184)$$

are the cross correlation of the received signal with the equalizer output and with the data, respectively.

Using the expression in (7.179) for z(t) in (7.182), these conditions can be expressed as the matrix equation $$[R_{yy}][A] = [R_{yd}] \quad (7.185)$$

$$\text{where } [R_{yy}] = \begin{bmatrix} R_{yy}(0) & R_{yy}(\Delta) & \cdots & R_{yy}(2N\Delta) \\ R_{yy}(-\Delta) & R_{yy}(0) & \cdots & R_{yy}[2(N-1)\Delta] \\ \vdots & & & \vdots \\ R_{yy}(-2N\Delta) & & \cdots & R_{yy}(0) \end{bmatrix} \quad (7.186)$$

$$\text{and } [R_{yd}] = \begin{bmatrix} R_{yd}(-N\Delta) \\ R_{yd}[-(N-1)\Delta] \\ \vdots \\ R_{yd}(N\Delta) \end{bmatrix} \quad (7.187)$$

and is defined by (7.175). Note that these conditions for the optimum tap weights using the LMSE criterion are similar to the conditions for the zero-forcing weights, except correlation-function samples are used instead of pulse-response samples.

There are other methods for determining tap weights, e.g., zero forcing, which can be applied for use in the invention.

A current time slot assigned for the timeshared tap weight processor 38 during a current data cycle is different than the next time slot during a next data cycle. Therefore, the tap weights are adapted for the current data cycle utilizing a current subset of data and the tap weights are adapted for the next data cycle utilizing a next subset of data.

By ensuring that the time slot assignments that are made for the tap weighting coefficient processor are changed from one read event to the next read event a signal having sufficient white noise to ensure adaptation to the best possible tap weighting coefficient vector is provided. M different time slot assignments (M<=N) may be cycled through M successive read events. This effectively increases the size of the set of data bits that are utilized to adapt the weighting coefficient of each tap by a factor of M. This results in adaptation which is closer to the best possible tap weight vector. Results of testing the present invention with a value for N=15 and M=8 and with 520 bytes of data resulted in an overall system performance improvement of 2 dB.

In essence, the relationship of the subset of data for the current and next cycles is such that for repetitive data each tap is not adapted with the small fraction, i.e., the subset, of all of the data bits. The selection of the subset of data by assigning a different time slot during the next data cycle exposes each of the tap coefficients to a larger set of data. FIGS. 3A and 3B represent how tap coefficients are updated by assigning a different time slot during the next data cycle that exposes each of the tap coefficients to a larger set of data.

An embodiment of an FIR filter in accordance with the present invention can be implemented on a single monolithic integrated circuit using techniques known to those skilled in the art.

Numerous modifications and alternative embodiments of the invention will be apparent of those skilled in the art in view of the foregoing description. Accordingly, this description is to be construed as illustrative only and is for the purpose of teaching those skilled in the art the best mode of carrying out the invention. Details of the structure may be varied substantially without departing from the spirit of the invention and the exclusive use of all modifications which come within the scope of the appended claim is reserved.

We claim:

1. In a digital adaptive finite impulse response filter having a plurality of tap weights, a method of adapting the plurality of tap weights, the method comprising the steps of:
   assigning a current time slot for a timeshared tap weight digital processor during a current data cycle;
   assigning a different time slot for said timeshared tap weight digital processor during a next data cycle;
   adapting said plurality of tap weights for said current data cycle utilizing a current subset of data; and
   adapting said plurality of tap weights [are adapted] for said next data cycle utilizing a next subset of data;
   wherein each of said plurality of tap weights were exposed to a larger set of data than if said different time slot was the same as said current time slot, when data is repetitive.

2. The method as recited in claim 1 further comprising assigning said different time slot for said next data cycle by rotating time slot assignments for said timeshared tap weight digital processor.

3. The method as recited in claim 1 further comprising assigning said different time slot for said next data cycle by rotating in ascending sequence time slot assignments for said timeshared tap weight digital processor.

4. The method as recited in claim 1 further comprising assigning said different time slot for said next data cycle by rotating in descending sequence time slot assignments for said timeshared tap weight digital processor.

5. The method as recited in claim 1 wherein said timeshared tap weight digital processor is timeshared for eight tap weights.

6. In an integrated circuit comprising a digital adaptive finite impulse response filter having a plurality of tap weights and a timeshared tap weight digital processor, an apparatus for adapting the plurality of tap weights, the apparatus comprising:
   a circuit assigning a current time slot for said timeshared tap weight digital processor during a current data cycle and assigning a different time slot for said timeshared tap weight digital processor during a next data cycle;
   a circuit for adapting said plurality of tap weights for said current data cycle utilizing a current subset of data and for adapting said plurality of tap weights are adapted for said next data cycle utilizing a next subset of data;
   wherein each of said plurality of tap weights were exposed to a larger set of data than if said different time slot was the same as said current time slot, when data is repetitive.

7. The apparatus as recited in claim 6 wherein said circuit further comprises means for assigning said different time slot for said next data cycle by rotating time slot assignments for said timeshared tap weight digital processor.

8. The apparatus as recited in claim 6 wherein said circuit further comprises means for assigning said different time slot for said next data cycle by rotating in ascending sequence time slot assignments for said timeshared tap weight digital processor.

9. The apparatus as recited in claim 6 wherein said circuit farther comprises means for assigning said different time slot for said next data cycle by rotating in descending sequence time slot assignments for said timeshared tap weigh digital processor.

10. An integrated circuit adaptive finite impulse response filter comprising:
   a plurality of multiplier circuits having an input and an output wherein each of said plurality of multiplier circuits multiplies a signal applied to said input by a predetermined tap weight providing a weighted signal which is applied to said output;

a plurality of delay stages coupled in sequence such that each input of each of said plurality of multiplier circuits has one of said plurality of delay stages coupled between;

a summer circuit coupled to each of the outputs of each of said plurality of multiplier circuits wherein said summer circuit provides and output signal which is a summation of said weighted signals;

a timeshared tap weight digital processor coupled to each of said plurality of multiplier circuits for providing said predetermined tap weight;

a circuit assigning a current time slot for said timeshared tap weight digital processor during a current data cycle and assigning a different time slot for said timeshared tap weight digital processor during a next data cycle;

a circuit for adapting said tap weights for said current data cycle utilizing a current subset of data and for adapting said tap weights for said next data cycle utilizing a next subset of data;

wherein tap weights are adapted for a current data cycle utilizing a current subset of data and said tap weights are adapted for a next data cycle utilizing a next subset of data so that each of said tap weights were exposed to a larger set of data than if said different time slot was the same as said current time slot, when data is repetitive.

11. The apparatus as recited in claim 10 wherein said circuit further comprises means for assigning said different time slot for said next data cycle by rotating time slot assignments for said timeshared tap weight digital processor.

12. The apparatus as recited in claim 10 wherein said circuit further comprises means for assigning said different time slot for said next data cycle by rotating in ascending sequence time slot assignments for said timeshared tap weight digital processor.

13. The apparatus as recited in claim 10 wherein said circuit further comprises means for assigning said different time slot for said next data cycle by rotating in descending sequence time slot assignments for said timeshared tap weight digital processor.

14. The apparatus as recited in claim 10 wherein said timeshared tap weight digital processor is timeshared for eight tap weights.

15. The apparatus as recited in claim 10 further comprising a sampler circuit having a predetermined sampling rate for sampling a signal and providing a sampled output to a current delay stage of said plurality of delay stages and to a current multiplier circuit of said plurality of multiplier circuits.

16. The apparatus as recited in claim 15, wherein said delay stage provides a delay related to said predetermined sampling rate.

\* \* \* \* \*